(12) United States Patent
Yoo et al.

(10) Patent No.: US 11,984,424 B2
(45) Date of Patent: May 14, 2024

(54) SEMICONDUCTOR PACKAGES USING PACKAGE IN PACKAGE SYSTEMS AND RELATED METHODS

(71) Applicant: SEMICONDUCTOR COMPONENTS INDUSTRIES, LLC, Phoenix, AZ (US)

(72) Inventors: Inpil Yoo, Unterhaching (DE); Maria Cristina Estacio, Lapulapu (PH); Jerome Teysseyre, Scottsdale, AZ (US); Seungwon Im, Seoul (KR); JooYang Eom, Gimpo-si (KR)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 169 days.

(21) Appl. No.: 17/158,143

(22) Filed: Jan. 26, 2021

(65) Prior Publication Data

US 2021/0242167 A1 Aug. 5, 2021

Related U.S. Application Data

(60) Provisional application No. 62/969,709, filed on Feb. 4, 2020.

(51) Int. Cl.
*H01L 23/00* (2006.01)
*H01L 21/56* (2006.01)
(Continued)

(52) U.S. Cl.
CPC .............. *H01L 24/92* (2013.01); *H01L 21/56* (2013.01); *H01L 23/49527* (2013.01);
(Continued)

(58) Field of Classification Search
CPC ......... H01L 24/92; H01L 24/24; H01L 24/29; H01L 24/32; H01L 24/40; H01L 24/73;
(Continued)

(56) References Cited

U.S. PATENT DOCUMENTS

| 8,405,206 B1 * | 3/2013 | Duetemeyer | ..... H01L 23/49811 |
| | | | 257/776 |
| 2013/0256856 A1 * | 10/2013 | Mahler | ................... H01L 24/92 |
| | | | 257/676 |

(Continued)

FOREIGN PATENT DOCUMENTS

| DE | 102014115909 A1 | 5/2016 | |
| JP | 2005011986 A * | 1/2005 | ....... H01L 23/49575 |

OTHER PUBLICATIONS

Search Report, German Patent Application No. 102021102421.8, dated Jul. 5, 2021, 6 pages.

*Primary Examiner* — Jasmine J Clark
(74) *Attorney, Agent, or Firm* — Adam R. Stephenson, LTD.

(57) ABSTRACT

Implementations of a semiconductor package may include two or more die, each of the two more die coupled to a metal layer at a drain of each of the two more die, the two or more die and each metal layer arranged in two parallel planes; a first interconnect layer coupled at a source of each of the two more die; a second interconnect layer coupled to a gate of each of the two or more die and to a gate package contact through one or more vias; and an encapsulant that encapsulates the two or more die and at least a portion of the first interconnect layer, each metal layer, and the second interconnect layer.

20 Claims, 18 Drawing Sheets

(51) Int. Cl.
 *H01L 23/31* (2006.01)
 *H01L 23/495* (2006.01)
 *H01L 23/52* (2006.01)

(52) U.S. Cl.
 CPC ........ *H01L 23/49575* (2013.01); *H01L 23/52* (2013.01); *H01L 24/24* (2013.01); *H01L 24/29* (2013.01); *H01L 24/32* (2013.01); *H01L 24/40* (2013.01); *H01L 24/73* (2013.01); *H01L 24/82* (2013.01); *H01L 24/83* (2013.01); *H01L 24/84* (2013.01); *H01L 23/3107* (2013.01); *H01L 23/49513* (2013.01); *H01L 2224/24011* (2013.01); *H01L 2224/24101* (2013.01); *H01L 2224/24105* (2013.01); *H01L 2224/24137* (2013.01); *H01L 2224/24246* (2013.01); *H01L 2224/29139* (2013.01); *H01L 2224/32245* (2013.01); *H01L 2224/40101* (2013.01); *H01L 2224/40137* (2013.01); *H01L 2224/73213* (2013.01); *H01L 2224/73217* (2013.01); *H01L 2224/73263* (2013.01); *H01L 2224/73267* (2013.01); *H01L 2224/82101* (2013.01); *H01L 2224/8384* (2013.01); *H01L 2224/8484* (2013.01); *H01L 2224/92142* (2013.01); *H01L 2224/92144* (2013.01)

(58) Field of Classification Search
 CPC ......... H01L 24/82; H01L 24/83; H01L 24/84; H01L 21/56; H01L 23/49527; H01L 23/49575; H01L 23/52
 USPC .................................................. 257/666, 678
 See application file for complete search history.

(56) References Cited

U.S. PATENT DOCUMENTS

2016/0126214 A1  5/2016  Hohlfeld et al.
2017/0271298 A1  9/2017  Heinrich et al.

* cited by examiner

SEMICONDUCTOR PACKAGES USING PACKAGE IN PACKAGE SYSTEMS AND RELATED METHODS

CROSS REFERENCE TO RELATED APPLICATIONS

This document claims the benefit of the filing date of U.S. Provisional Patent Application 62/969,709, entitled "Semiconductor Packages using Package in Package Systems and Related Methods" to Yoo et al. (the '709 Application) which was filed on Feb. 4, 2020, the disclosure of which is hereby incorporated entirely herein by reference.

BACKGROUND

1. Technical Field

Aspects of this document relate generally to systems and methods used for packaging semiconductor die. Particular implementations also include packages containing multiple embedded semiconductor die.

2. Background

Semiconductor die include various electronic devices that perform a variety of electrical functions. Examples of electrical functions that can be performed by semiconductor die include rectifying, data storage, switching, data processing, logic operations, and many others.

SUMMARY

Implementations of a semiconductor package may include two or more die, each of the two more die coupled to a metal layer at a drain of each of the two more die, the two or more die and each metal layer arranged in two parallel planes; a first interconnect layer coupled at a source of each of the two more die; a second interconnect layer coupled to a gate of each of the two or more die and to a gate package contact through one or more vias; and an encapsulant that encapsulates the two or more die and at least a portion of the first interconnect layer, each metal layer, and the second interconnect layer.

Implementations of semiconductor packages may include one, all, or any of the following:

The encapsulant may encapsulate a portion of the gate package contact.

Each metal layer and the gate package contact may be configured to couple with a substrate.

The first interconnect layer may be configured to couple with a clip and electrically coupled with a substrate through the clip.

The second interconnect layer may be configured to couple with a clip.

The two or more die may be power semiconductor die.

The two or more die include silicon carbide.

The package may include a leadframe where the first interconnect layer, the second interconnect layer, each metal layer, and the gate package contact may be included in the leadframe.

Implementations of a semiconductor package may include two or more encapsulated die assemblies. Each encapsulated die assembly may include two or more die, each of the two more die coupled to a metal layer at a drain of each of the two more die; a first interconnect layer coupled at a source of each of the two more die; a second interconnect layer coupled to a gate of each of the two or more die and to a gate package contact through one or more vias; and an encapsulant surrounding the two or more die and at least a portion of the first interconnect layer, each metal layer, and the second interconnect layer. The package may further include one of a substrate or a leadframe coupled to the two or more encapsulated die assemblies; and two or more clips coupled to a source side of the two or more encapsulated die assemblies.

Implementations of a semiconductor package may include one, all, or any of the following:

The one of the substrate or the leadframe may be coupled to the two or more encapsulated die assemblies at a drain side of the two or more encapsulated die assemblies.

At least three die may be electrically coupled in parallel in each of the two or more encapsulated die assemblies.

The package may include two or more leads coupled to the one of the substrate or the leadframe.

The package may include one or more clips coupled to the one of the substrate or the leadframe.

The package may include an encapsulant surrounding the two or more encapsulated die assemblies and at least a portion of the one of the substrate or the leadframe.

The two or more encapsulated die assemblies further include a leadframe.

Implementations of a method of forming a semiconductor package may include forming one or more die assemblies by: providing two or more die; coupling each of the two or more die to a metal layer at a drain of each of the two or more die; forming a first interconnect layer coupled to a source of each of the two or more die; encapsulating the two or more die with an encapsulant, at least a portion of the first interconnect layer, and at least a portion of each metal layer using one of a transfer molding or laminating process; and forming a second interconnect layer coupled to a gate of each of the two or more die and to a gate package contact using one of a clip or one or more vias. The method may also include coupling the one or more die assemblies to one of a substrate or a leadframe.

Implementations of a method of forming a semiconductor package may include one, all, or any of the following:

The method may include coupling two or more clips to a source side of the two or more encapsulated die assemblies.

Coupling each of the two or more die to the metal layer further may include using a silver sintering film and pressure sintering.

Forming one or more die assemblies further may include grinding the encapsulant to expose at least the portion of the first interconnect layer and at least the portion of each metal layer.

Forming one or more die assemblies further may include forming one or more vias in the encapsulant using a laser and filling the one or more vias with copper through electroplating.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

Figure 1:
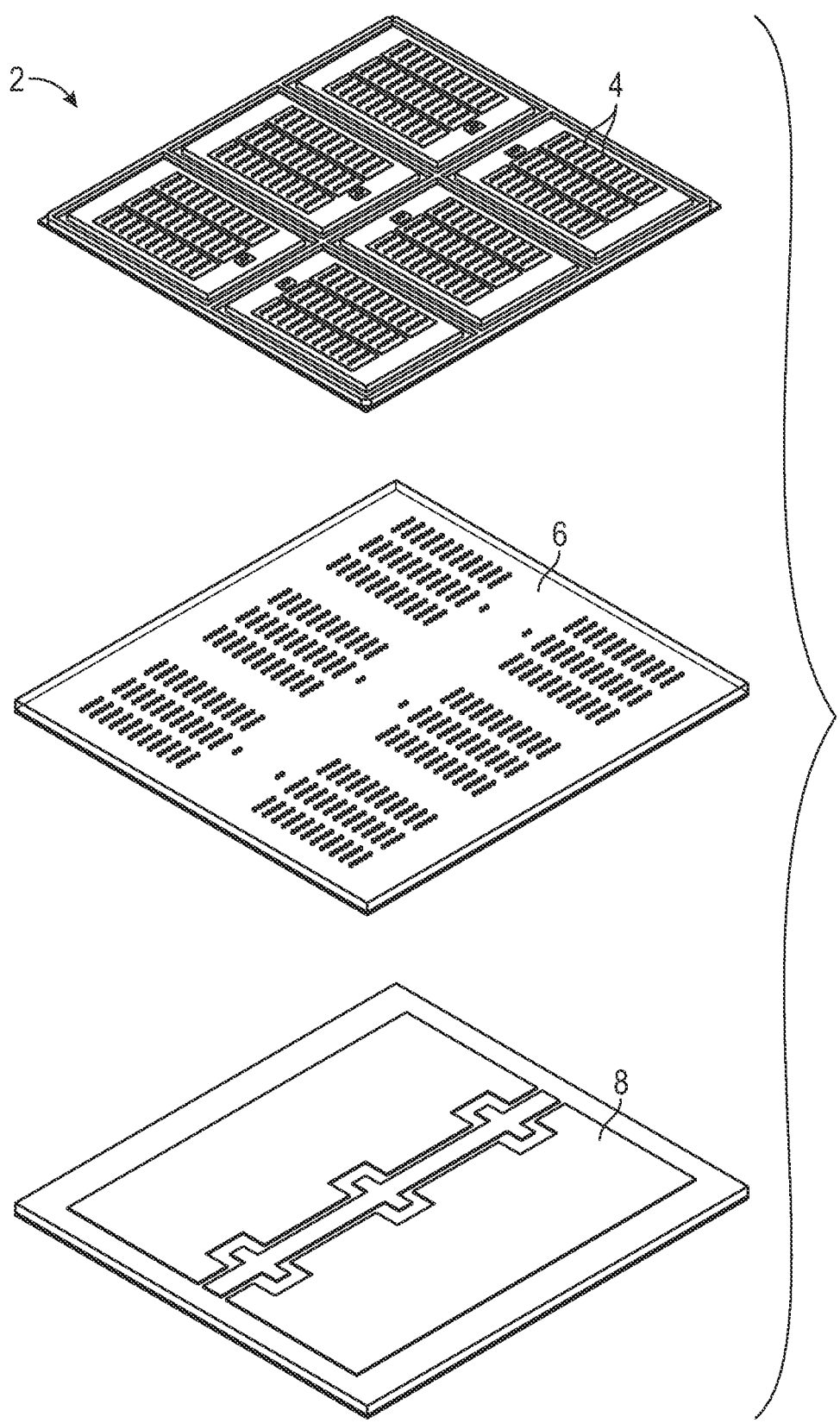
FIG. 1 is a perspective view of an implementation of a semiconductor package at three points in an implementation of a method of manufacturing a semiconductor package.

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

In various semiconductor packages like those disclosed herein, the semiconductor die may be formed on a wide variety of semiconductor substrate types, such as, by non-limiting example, silicon, silicon carbide, glass, silicon-on-insulator, ruby, gallium arsenide, silicon dioxide, and any other semiconductor substrate type. The various semiconductor die may include any of a wide variety of semiconductor devices, including, by non-limiting example, diodes, insulated gate bipolar transistors (IGBTs), rectifiers, switches, power devices, metal oxide gate field effect transistors (MOSFETs), or any other semiconductor device type.

Semiconductor packages can utilize a substrate to which one or more semiconductor die are coupled electrically and/or physically. In various implementations, a semiconductor die is physically and electrically coupled on a drain side of the die to a metal layer or metal alloy layer on a first side of the substrate. If the substrate is a dual sided substrate as in a direct bonded copper (DBC) substrate, the metal layer may include various traces and another metal layer is present on the other second side of the substrate. Between the metal layers is a layer of dielectric material, such as, by non-limiting example, an aluminum oxide, aluminum nitride, or other dielectric material. The remaining electrical connections to the source and/or gate of the semiconductor die are made to the metal layer on the first side of the substrate using wirebonds. In a particular implementation, four semiconductor die may be coupled to the first face of a DBC substrate and wired in parallel using the traces formed in the metal layer and 12 wirebonds. For this design, the thermal resistance between the 4 die and the ultimate foot of the package (junction-to-foot thermal resistance, RthJ-F) is about 0.24 (C/W). An example of a cross sectional view of such a package design is illustrated as Package 1 on p. 1 of Appendix A of the '709 Application previously incorporated by reference.

Where a flip chip semiconductor die is used, wirebonds are not needed as the semiconductor die can be coupled to the first layer of the DBC substrate at the source and gate side utilizing the bumps or pillars of the flip chip die to make the physical and electrical connections with the first layer. In a particular example, four flip chip die are electrically connected in parallel using the first layer of the DBC without using wirebonds forming a package with an RthJ-F of about 0.31 (C/W). The higher thermal resistance of this design is in part because the physical area of the source and gate of each die is about 20% smaller than the area of the drain of each semiconductor die. Because there is less physical contact area between each die and the first layer of the DBC, the amount of heat during operation that can be transferred is correspondingly reduced. An example of such a package design is illustrated as Package 2 on p. 1 of Appendix A of the '709 Application previously incorporated by reference.

In other package designs, a substrate may not be directly coupled to the substrate, but the semiconductor die can be coupled between a leadframe and an interconnect layer in an encapsulant. In such a design, the drain side of the die is coupled to the leadframe and the source and gate sides of the die are coupled to the interconnect layer. The encapsulant fills the remaining space around the die between the leadframe and the interconnect layer. The interconnect layer includes one or more vias in the encapsulant that bond to the electrical connection pad(s) on the semiconductor die. In a particular package design, four die are embedded in the encapsulant, no wirebonding is used, and the heat dissipation path to the substrate is through the interconnect layer on the source and gate side of the die. Because of this, while this design may have better electrical parallel design for the semiconductor die than the Package 1 and Package 2 designs, the RthJ-F may be no better than the flip chip design of Package 2 where no wirebonds are used either at about 0.31 (C/W). An example of this package design is illustrated as the final drawing in FIG. 7 of the present application.

In various implementations of semiconductor packages, each semiconductor die may be coupled with a metal layer (slug, foil, or leadframe) on the drain side of each die and then an interconnect layer used to couple with the source and a separate interconnect layer used to couple with the gate. Referring to the cross sectional view of such a package of FIG. 7, two semiconductor die are coupled to a metal layer on the drain side of each die, the sources of each die are coupled to a first interconnect layer, and the gates of both die are coupled together and to a gate package contact through two vias through an encapsulant material that encloses the space around each die and between the interconnect layers and the metal layers. Because pairs of die can be coupled together, in this package design, six die can be packaged in the encapsulant with no wirebonds used. Because the metal layers can then be coupled to a substrate like any disclosed in this document, each die has its drain side thermally coupled to the substrate. Because of this, the RthJ-F may be the same as for Package 1, about 0.24 (C/W) because of the larger area of each die that is thermally coupled with the substrate. Also, the additional metal layer of the gate package contact facilitates additional heat transfer to the substrate itself. This package design may also allow for good parallel electrical connection of the six semiconductor die in the package.

Figure 2:
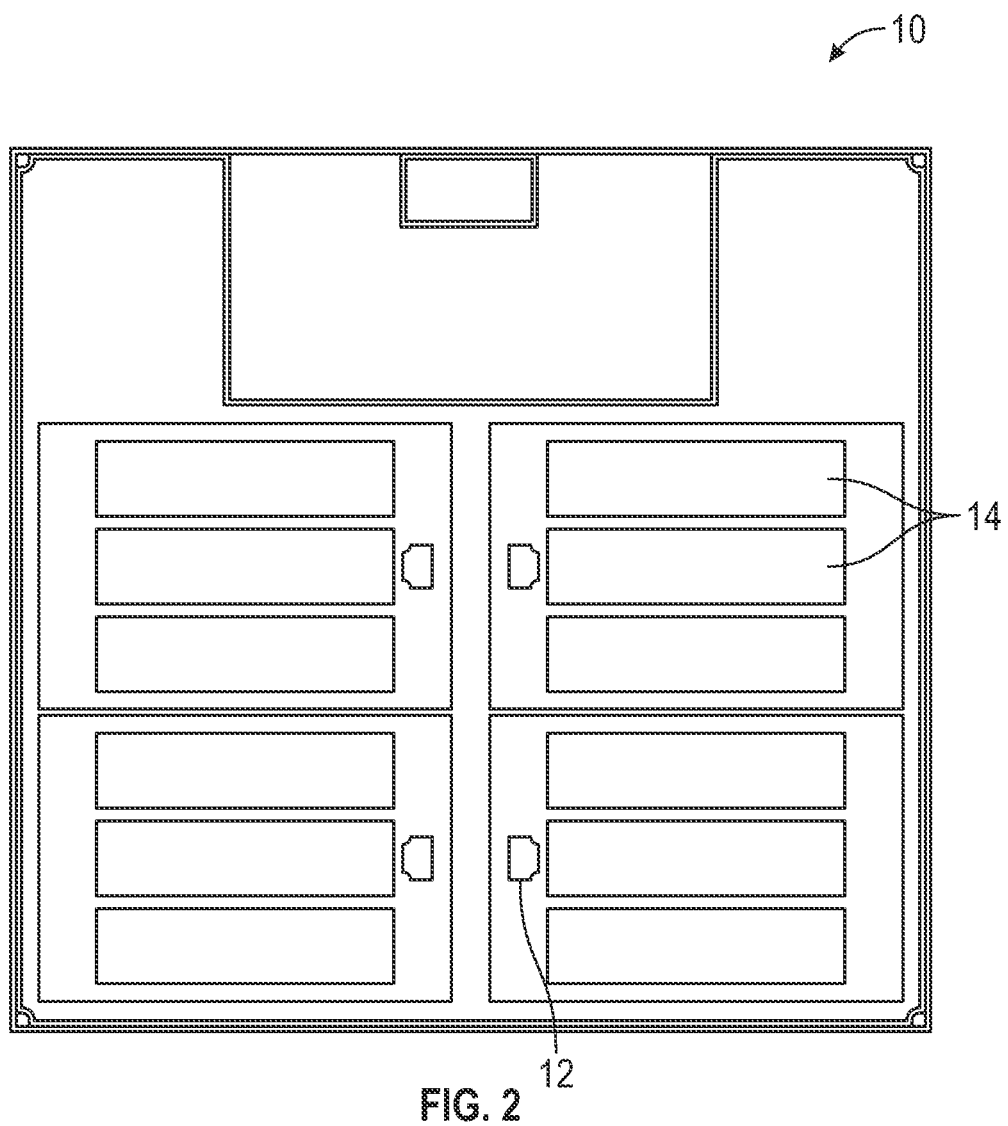
FIG. 2 is a die-side view of a semiconductor package implementation comprising four die.

Referring to FIG. 1, an implementation of a six die semiconductor package implementation 2 is illustrated showing copper vias 4 formed above the source and drain regions of each die (along with the gate regions as well). As will be described further herein, the copper vias 4 are formed through exposing the metal materials of the die by drilling through the encapsulant 6 with a laser and then electroplating metal into the vias as illustrated in the middle figure in FIG. 1. The lowermost drawing in FIG. 1 illustrates the package 2 after a redistribution layer 8 has been plated over the exposed vias. FIG. 2 illustrates a top die-side view of implementation of a four die semiconductor package 10 with the redistribution layer overlaid over the four die. As illustrated, each die is placed drain side down against the leadframe with the source 14 and gate 12 side up. In this document the term "die-side" refers to the side of the package where the die are facing the viewer and the term "leadframe side" refers to the side of the package where the lead frame is facing the viewer.

Figure 3:
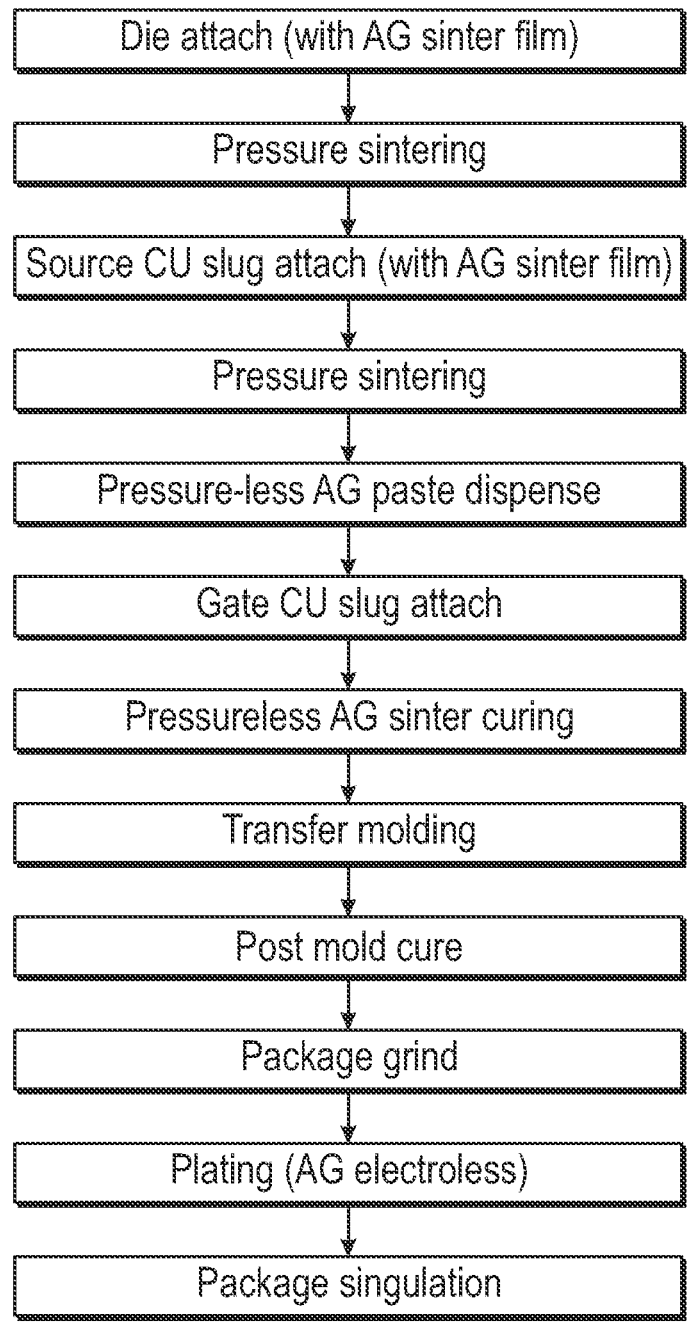
FIG. 3 is a flowchart of a first implementation of a method of manufacturing a semiconductor package.

Various implementations of methods of forming semiconductor packages may be used to form the different implementations of packages disclosed in this document. Referring to FIG. 3, a flowchart 15 of a first method implementation that employs transfer molding is illustrated. As illustrated, the die are first attached to a frame/lead frame using a silver sinter film. In this implementation, pressure sintering is then used to couple the die to the frame. A source copper slug (a copper slug attached to the source) is then attached over the source of each of the die using a silver sintering film. In this implementation, pressure sintering is used to couple the copper slug to the die. A silver paste is then dispensed over the gate region of each die using a pressure-less dispensing process. A copper slug/clip is then coupled over the silver paste and secured using pressure-less silver sinter curing to form a first interconnect layer. The frame, die, and slugs/clips then are placed in a mold and encapsulated with an encapsulant using a transfer molding process. The molded package then is cured in a post mold cure process. The package is then ground to expose the surfaces of the slugs/clips and to expose other electrical connectors through the material of the encapsulant. The exposed metal features of the package then are plated with metal to form a second interconnect layer calling. In this implementation, an electroless Ag or NiAu plating process is used to deposit a silver film over the exposed metal of the package/second interconnect layer. Following the plating process, the packages are then singulated using any of a wide variety of singulation techniques, including, by non-limiting example, sawing, lasering, jet ablating, etching, or any combination thereof.

Figure 4:
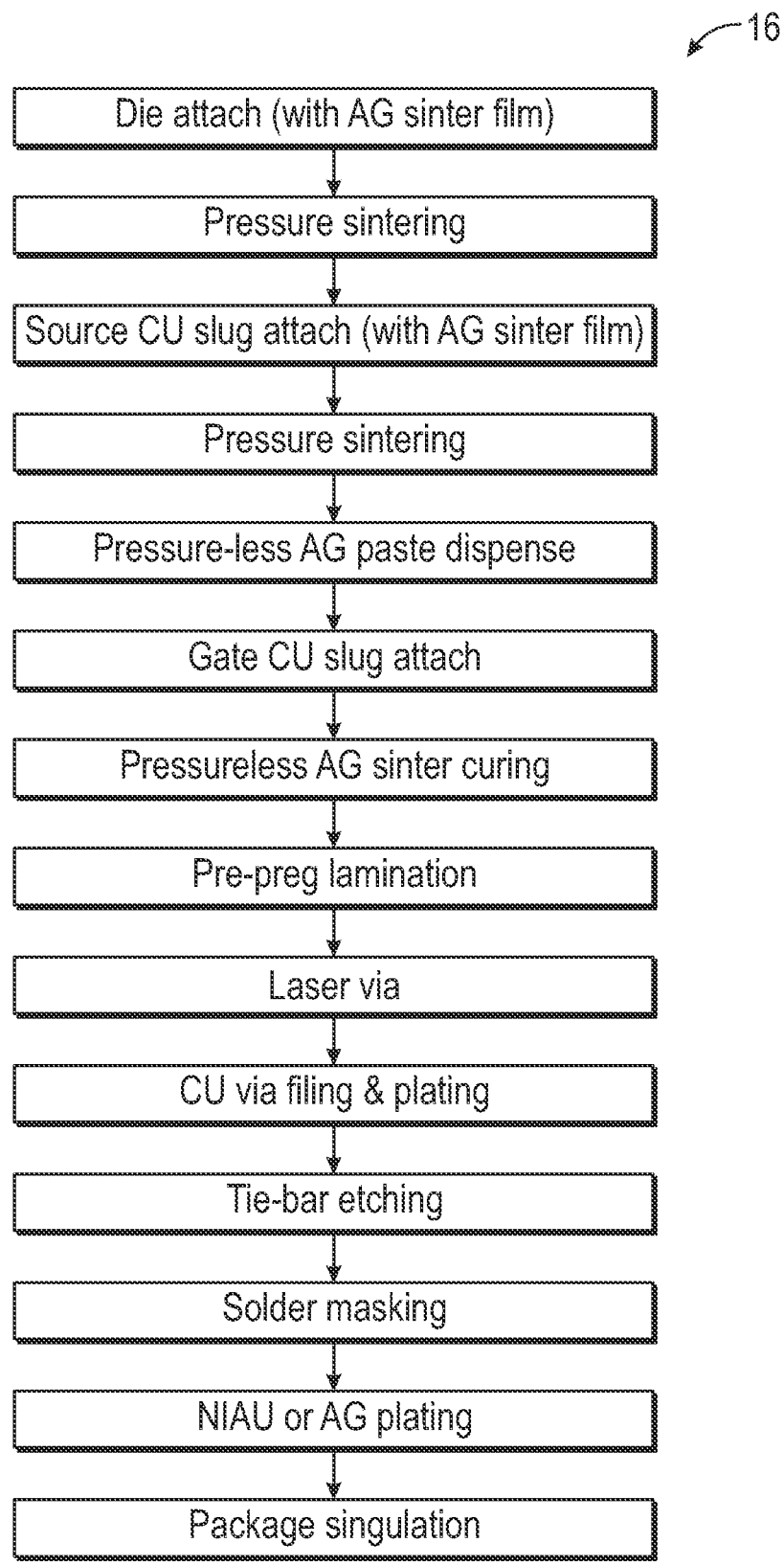
FIG. 4 is a flowchart of a second implementation of a method of manufacturing a semiconductor package.

Referring to FIG. 4, a flow chart 16 of another implementation of a method of forming semiconductor packages like those disclosed herein is illustrated. Like the implementation in FIG. 3, the various die attach, pressure sintering, and source and gate copper slug attach and sintering processes are utilized to couple the die and slugs with the frame. In this implementation, however, a lamination process is used to encapsulate the die, slugs, and frame. A pre-preg lamination process is used to apply an encapsulant over the die, slugs and frame. In particular implementations, the vias are then exposed using a lasering process followed by a copper via filling and plating process to extend the material of the vias up to the outer surface of the encapsulant. As indicated in FIG. 4, in some implementations, a package grinding process may be used instead of lasering and plating to create the copper vias. Using grinding may reduce dimpling issues observed with plated up vias. In this method implementation, a tie-bar etching process is followed by solder masking of the various vias and exposed metal features on the package. A plating step (NiAu or Ag) is then performed using an electroplating or electroless plating process (or a combination of both) in various implementations. Following the plating process, the packages are then singulated using any singulation method disclosed in this document.

Figure 5:
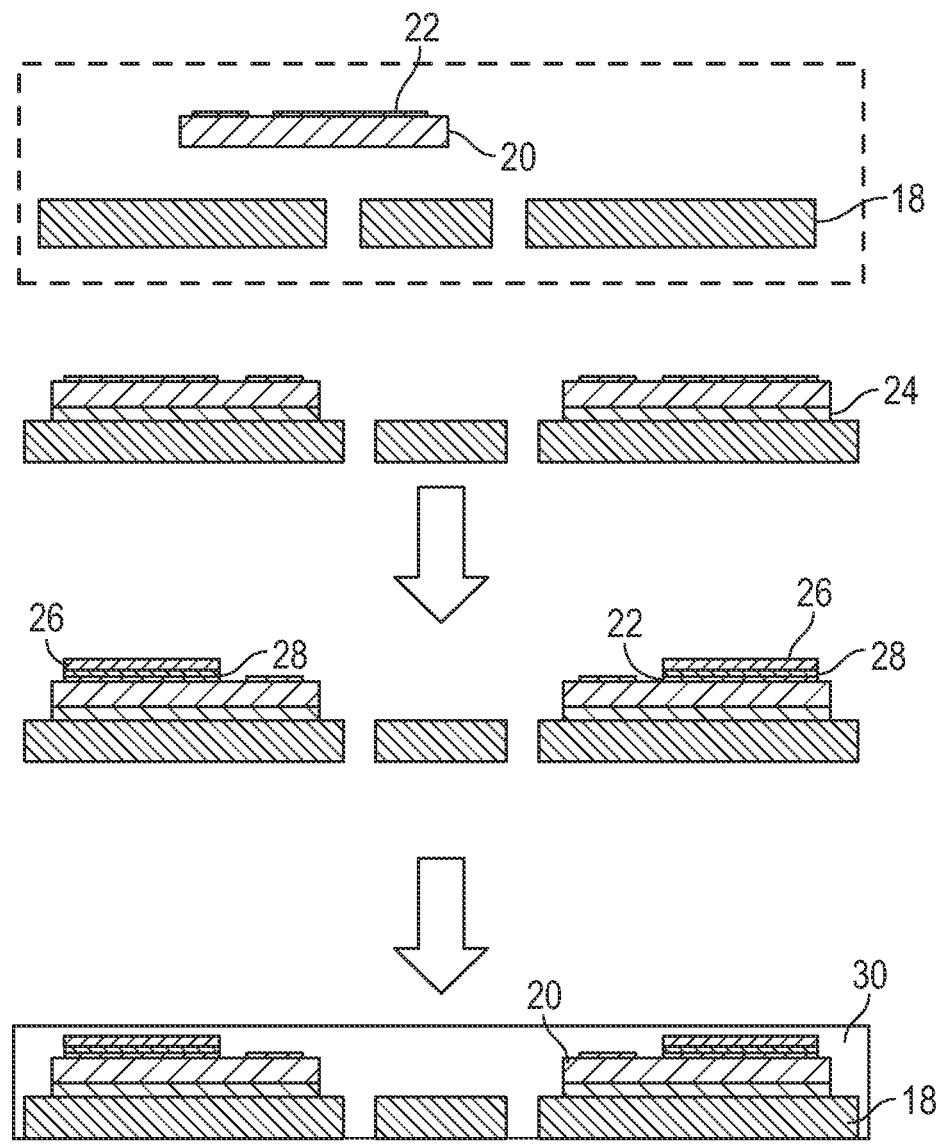
FIG. 5 is a cross sectional view of an implementation of a first semiconductor package at various points in an implementation of method of manufacturing a semiconductor package.

FIGS. 5-7 and 8-12 illustrate a cross-sectional view and top view, respectively of an implementation of a semiconductor package following various steps of an implementation of two methods of forming a semiconductor package like those illustrated in the flowcharts of FIG. 4 and FIG. 3, respectively. The components illustrated in the dotted box of the top of FIG. 5 illustrates the preparation of the frame 18 and application/preparation of copper metal 22 to the top of each die 20. Each die 20 is then attached to the frame 18 using a silver sintering process using a silver sintering material 24 which may be pressure-assisted in particular implementations. Other materials other than a silver sintering material may be employed including any capable of performing a die bonding or attach function such as, by non-limiting example solder, or die attach film. A top copper slug 26 is then attached using a silver sintering process and a silver sintering material 28 to the copper metal 22 forming a first interconnect layer. In this method implementation, a lamination process is then used to apply an encapsulant 30 over the die 20 and the frame/lead frame 18. While the use of a lamination process to apply the encapsulant is illustrated here, other encapsulating processes may be utilized in various implementations like any disclosed in this document including, by non-the example, injection molding, transfer molding, or any other encapsulating process.

Figure 6:
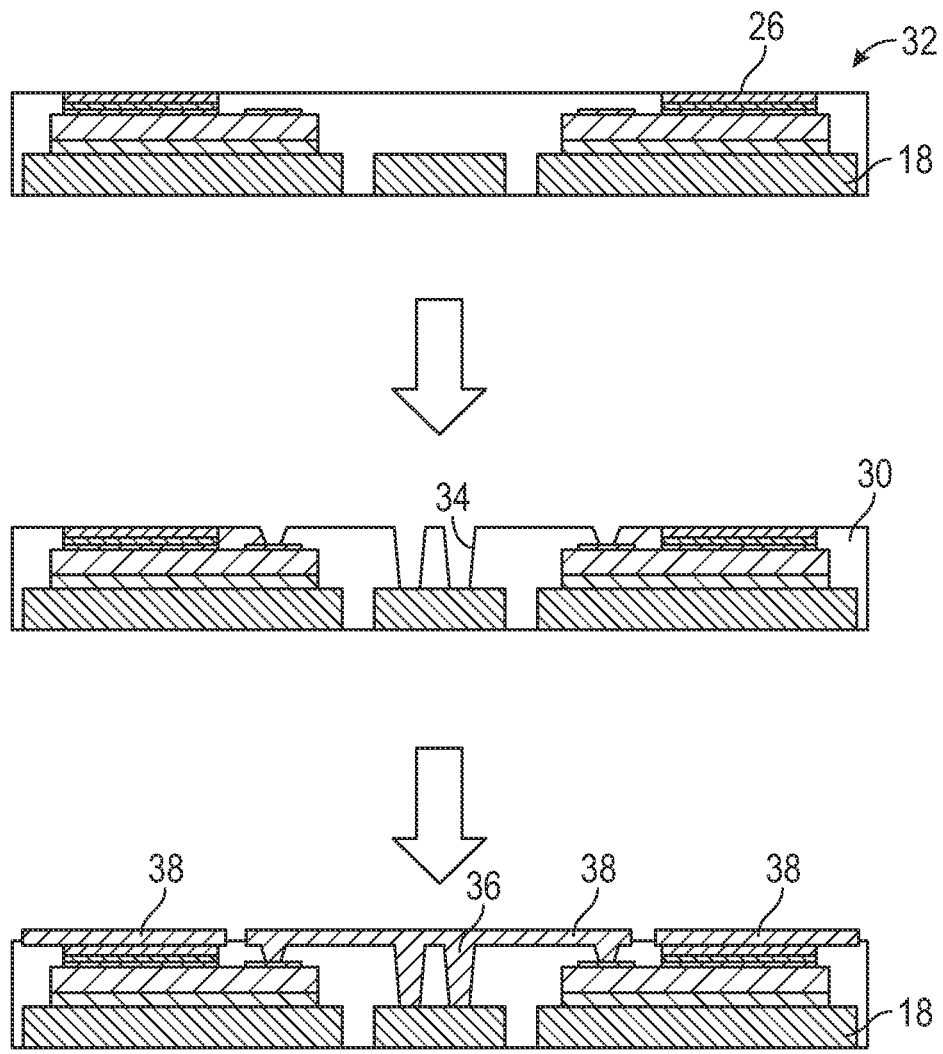
FIG. 6 is a cross sectional view of the implementation of a first semiconductor package of FIG. 5 at various points in the implementation of method of manufacturing a semiconductor package.

FIG. 6 illustrates the package 32 following a grinding process to expose the copper metal of the frame 18 and the copper slugs 26. Openings 34 are then formed using a lasering or etching process into the material of the encapsulant 30 followed by a copper plating process to form vias 36 and additional metal over the copper slugs, forming a second interconnect layer 38. While an implementation of FIG. 6 the use of vias to form the connections with the second interconnect layer 38 is employed, in other implementations, as previously discussed, a grinding step may be sufficient alone to expose the material needed to electroplate the second interconnect layer 38 to the material of the lead frame 18.

Figure 7:
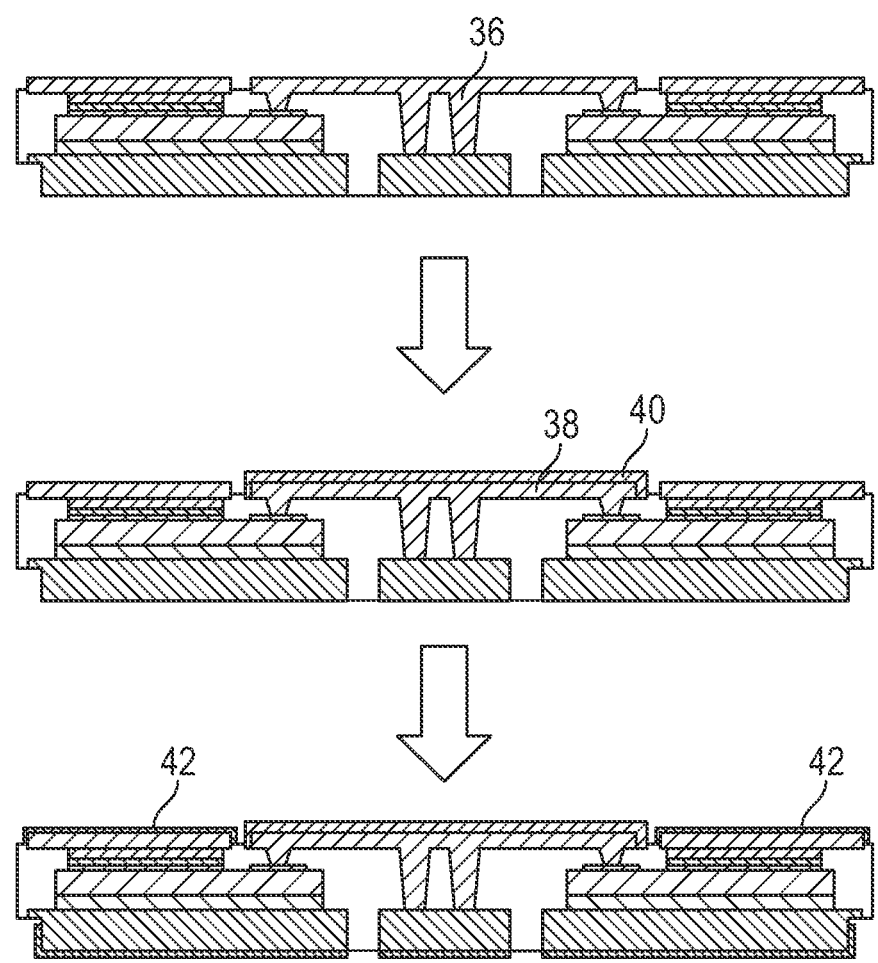
FIG. 7 is a cross sectional view of the implementation of a first semiconductor package of FIG. 5 at various points in the implementation of method of manufacturing a semiconductor package.

As illustrated in FIG. 7, a copper tie bar etching process is then used to eliminate tie bars (not shown) used during the electroplating process to ensure electroplating of the via structure 36. In the method implementation illustrated, a solder masking process is then used to apply solder 40 to the surface of the portion of the second interconnect layer 38 that includes the copper vias. In various implementations, an electroless plating process is then used to apply a layer of NiAu 42 to the exposed metal surfaces of the package. A singulation step may then used to singulate the various semiconductor packages being formed together in a panel or group of frames. In so method implementations, the singulation step may be included where the semiconductor packages are formed lead frame by lead frame.

Figure 8:
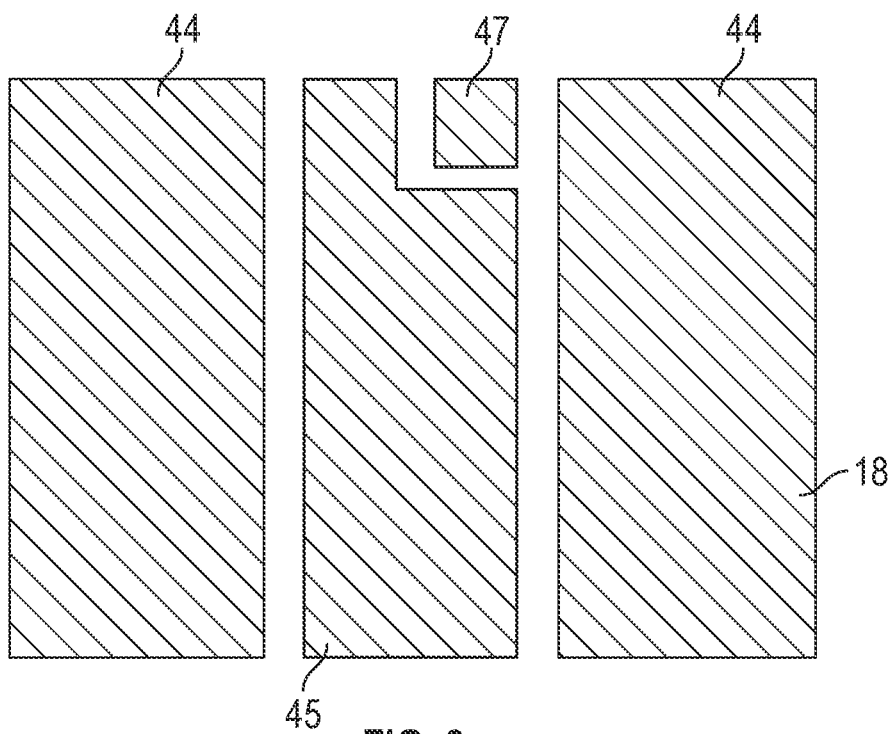
FIG. 8 is a die-side view of the implementation of a first semiconductor package of FIG. 5 showing the leadframe.
Figure 9:
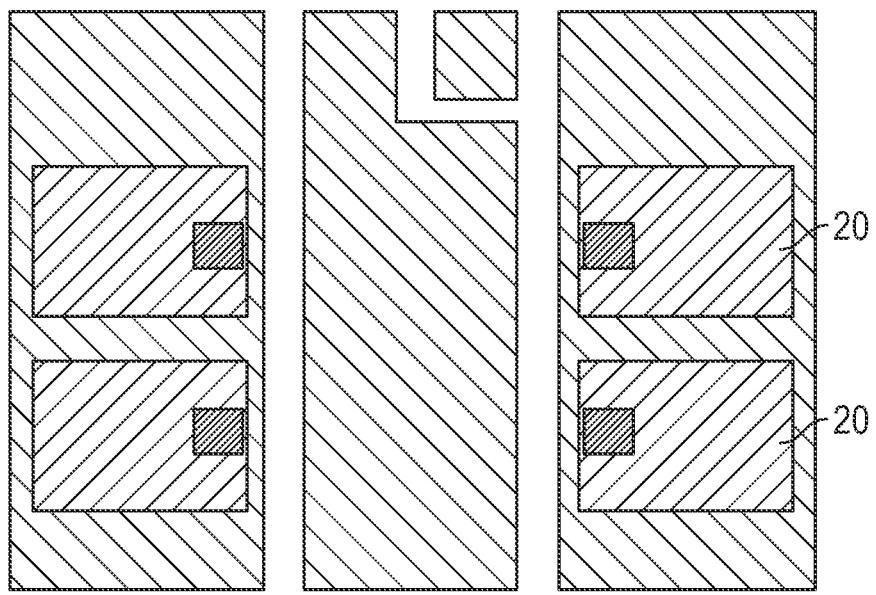
FIG. 9 is a die-side view of the implementation of a first semiconductor package of FIG. 5 following die attach.
Figure 10:
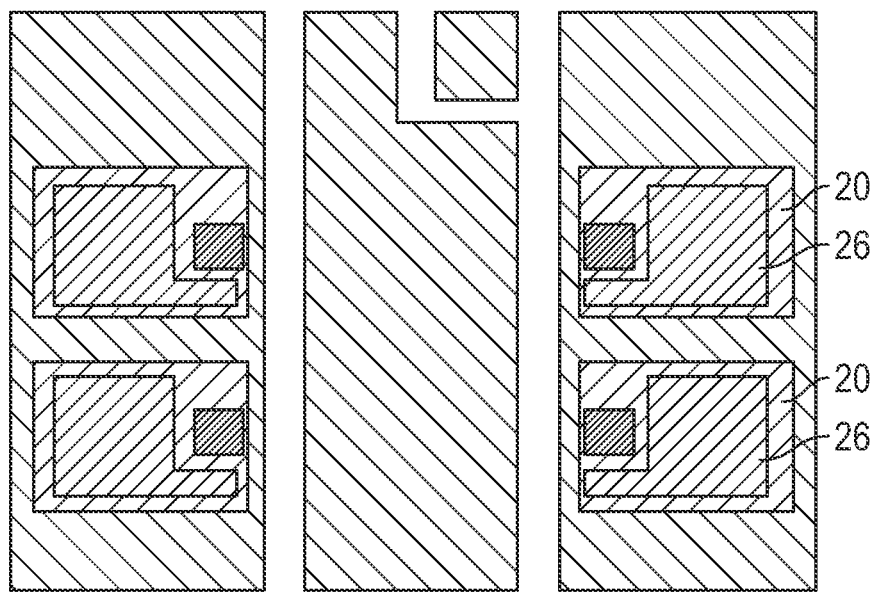
FIG. 10 is a die-side view of the implementation of the first semiconductor package of FIG. 5 following copper sintering.
Figure 11:
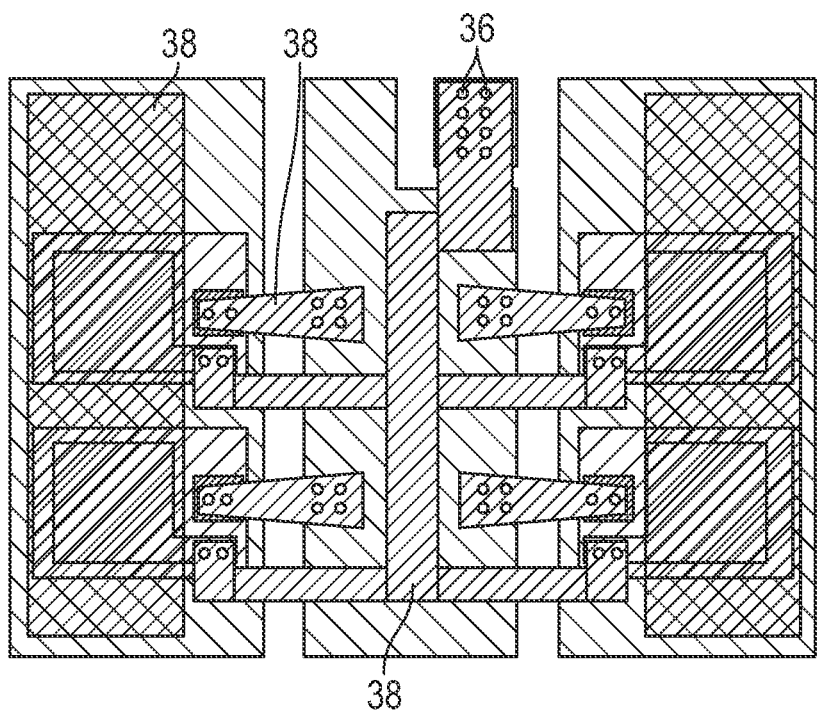
FIG. 11 is a die-side view of the implementation of the first semiconductor package of FIG. 5 following via formation and redistribution layer formation.
Figure 12:
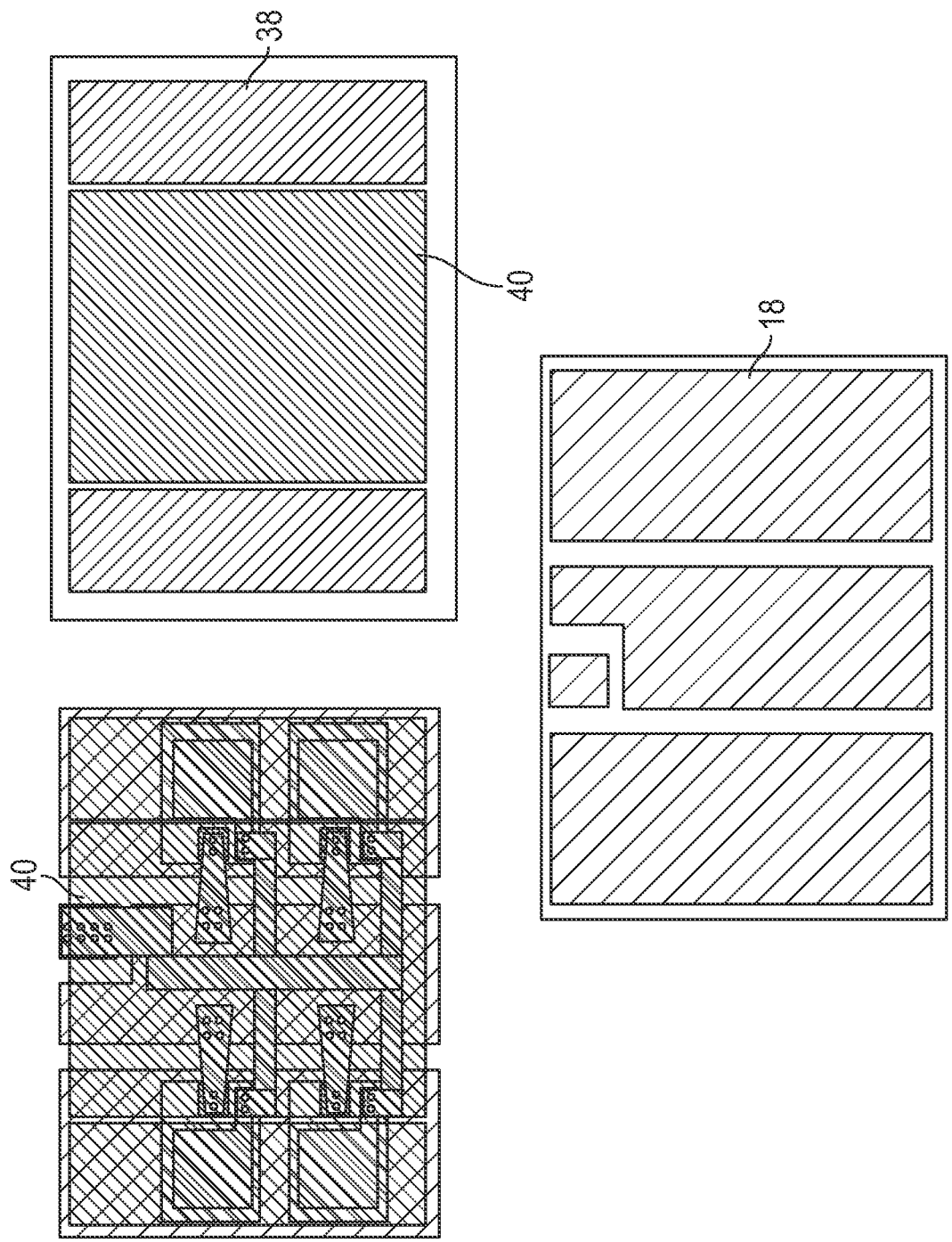
FIG. 12 illustrates at the top left the first semiconductor package of FIG. 5 following solder masking, at the top right, a top die-side view of the package contacts following molding, and at the bottom center, a bottom leadframe side view of the package contacts following molding.

FIG. 8 illustrates as die-side (live bug) view of the implementation of a lead frame 18 showing the two drain portions 44, a gate portion 45, and the kelvin gate portion 47. The drain portions are the portions to which the drains of the various semiconductor die will be directly coupled through the die attach material. FIG. 9 illustrates four die 20 after die attach to the frame. FIG. 10 illustrates the four die 20 after application of the top copper slugs 26 to each of the die 20 to form the first interconnect layer. FIG. 11 illustrates in partial see-through the structure of the second interconnect layer 38 which is/forms a redistribution layer between the various components of the frame and the sources and drains of the various die in using the vias 36. The top left figure in FIG. 12 illustrates the top of the package following solder masking to form a solder mask layer 40. The top right figure in FIG. 12 illustrates the die-side view of the top of the package with the surfaces of the solder mask layer 40 and the second interconnect layer 38. The bottom center figure of FIG. 12 illustrates a leadframe side view of the package showing the portions of the lead frame 18 exposed through the encapsulant to form the bottom package contacts.

Figure 13:
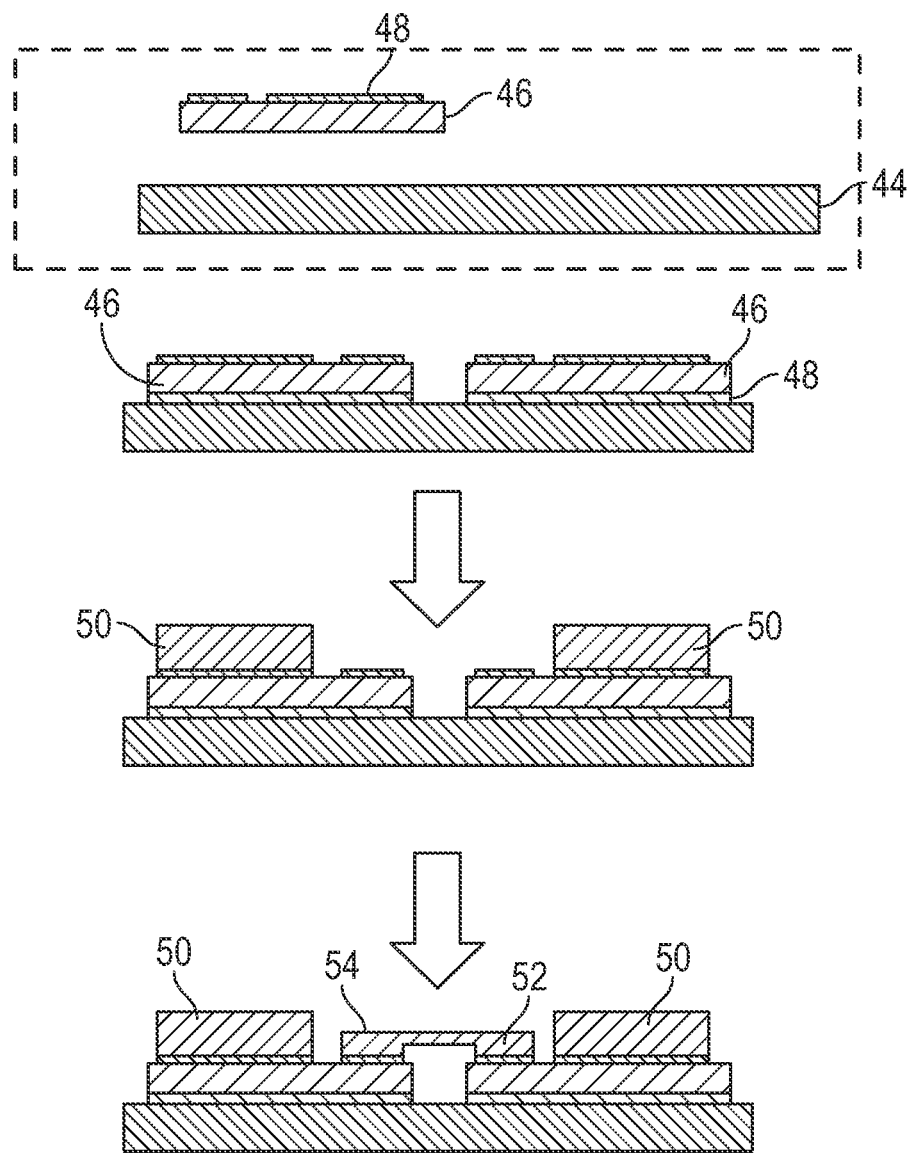
FIG. 13 is a cross sectional view of an implementation of a second semiconductor package at various points in an implementation of method of manufacturing a semiconductor package.
Figure 14:
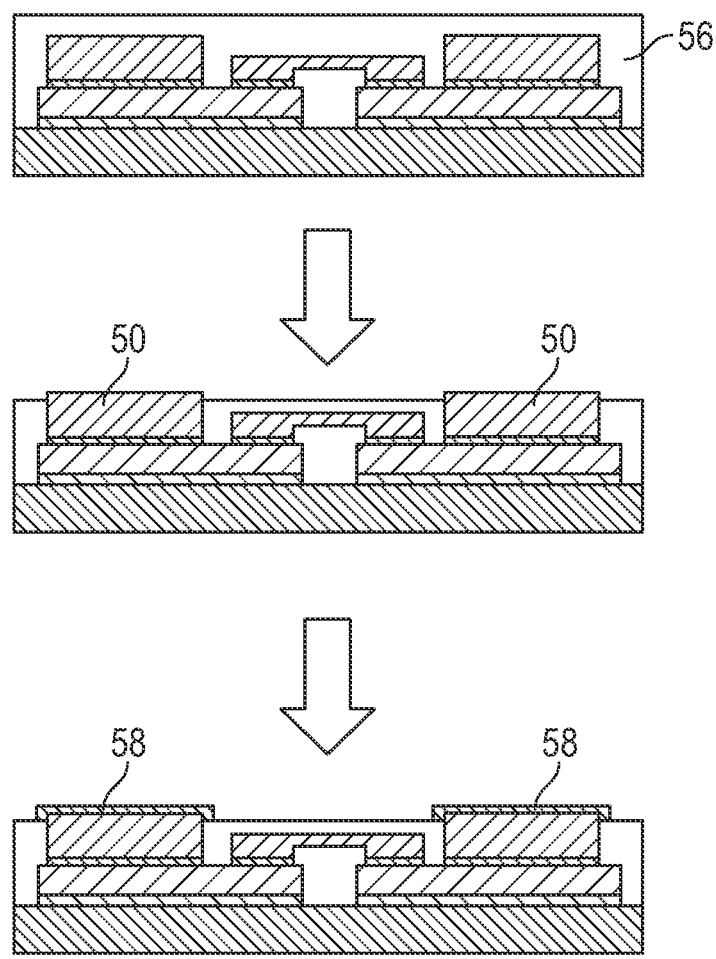
FIG. 14 is a cross sectional view of the implementation of a second semiconductor package of FIG. 13 at various points in the implementation of method of manufacturing a semiconductor package.
Figure 15:
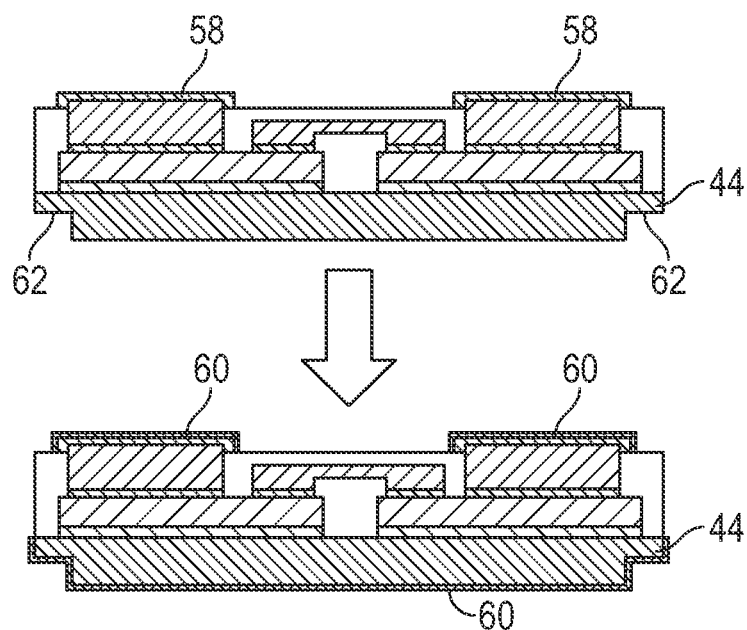
FIG. 15 is a cross sectional view of the implementation of a second semiconductor package of FIG. 13 at various points in the implementation of method of manufacturing a semiconductor package.

FIGS. 13-15 and 16-22 illustrate cross sectional and top/die-side views of a semiconductor package after various steps of a method of forming a semiconductor package have been performed where the method implementations like that illustrated in FIG. 3. Referring to FIG. 13, in the dotted rectangle a lead frame/frame 44 is illustrated along with a die 46 to which a silver top metal layer 48 has been applied. In various implementations, the die 46 may be 4 mils in thickness of the die may be thinner or thicker than this in other implementations. The die 46 are then illustrated following die attach using pressure silver sintering material 48. As illustrated in FIG. 13, a copper slug 50 is then attached to the die 46 via silver sintering to form a first interconnect layer. As illustrated, in various implementations, the copper slug 50 may have a thickness of about 15 mils, or over about 3 times the thickness of the die but in various implementations, thicker or thinner copper slugs may be employed. FIG. 13 illustrates a gate clip/slug 52 that electrically couples the gates of the two die after application using a pressure-less silver sintering process which forms a second interconnect layer 54. In various implementations, as illustrated, the gate clip due to is about 10 mils in thickness, measured at the thickest portion of the clip. Referring to FIG. 14, a lamination molding process is then used to encapsulate the die-side of the package with encapsulant 56 following by an encapsulant cure process. In various implementations, however any method of encapsulating disclosed herein may be employed to apply the encapsulant. A grinding process is then used to expose the upper surfaces of the copper slugs 50 followed by a copper plating process used to form an interconnect/redistribution layer 58 between the copper slugs 50 best illustrated in FIG. 18 to finish forming the first interconnect layer. Referring to FIG. 15, a copper tie bar etching process is then used to remove tie bars (not shown) that were utilized during the electroplating process. A finish layer 60 of metal to the surfaces of the interconnect/redistribution layer and the surface of the frame may be applied either through electroplating or electroless plating. This finish layer of metal may be any similar layer disclosed in this document in various implementations. As illustrated in FIG. 15, in some package implementations, recesses/grooves 62 may be formed in the surfaces of the frame 44 that are located adjacent to the edges of the package either during the processing of the frame, or at the time of forming the frame itself. FIG. 15 illustrates how the finished layer material 60 may also be applied to the exposed portions of the frame 44 itself in the process.

Figure 16:
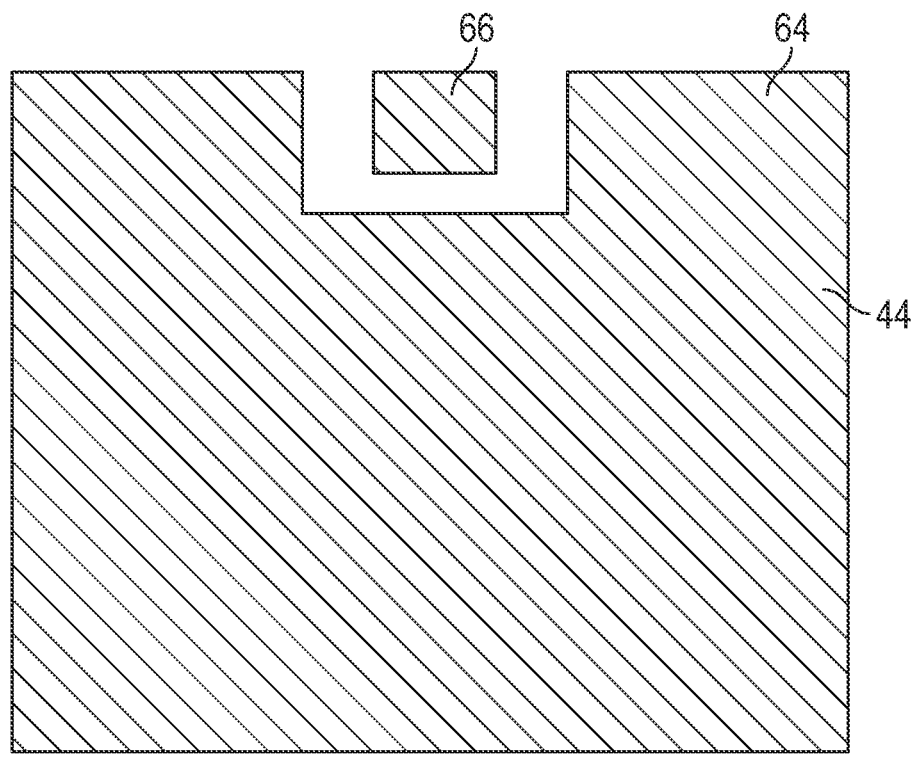
FIG. 16 is a die-side view of the implementation of a second semiconductor package of FIG. 13 showing the leadframe.
Figure 17:
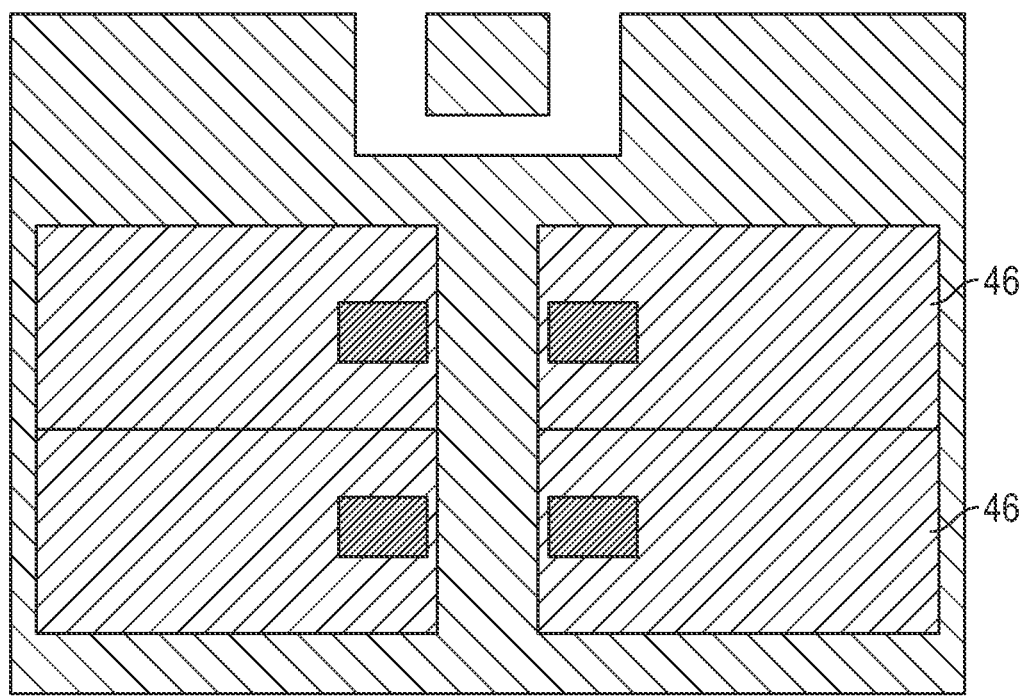
FIG. 17 is a die-side view of the implementation of a second semiconductor package of FIG. 13 following die attach.
Figure 18:
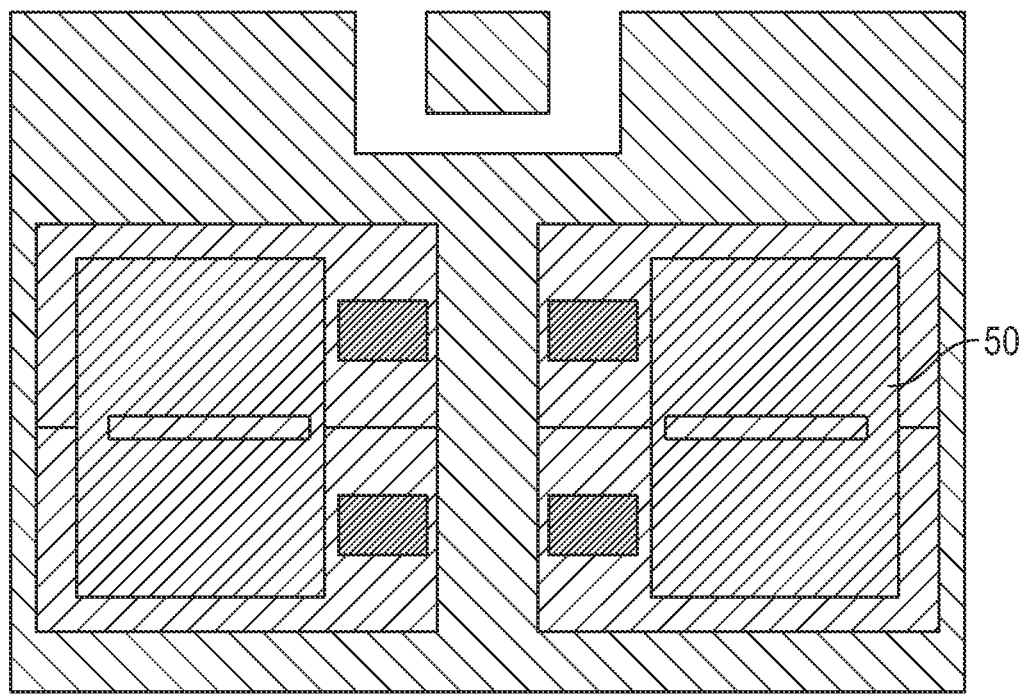
FIG. 18 is a die-side view of the implementation of the second semiconductor package of FIG. 13 following copper sintering.
Figure 19:
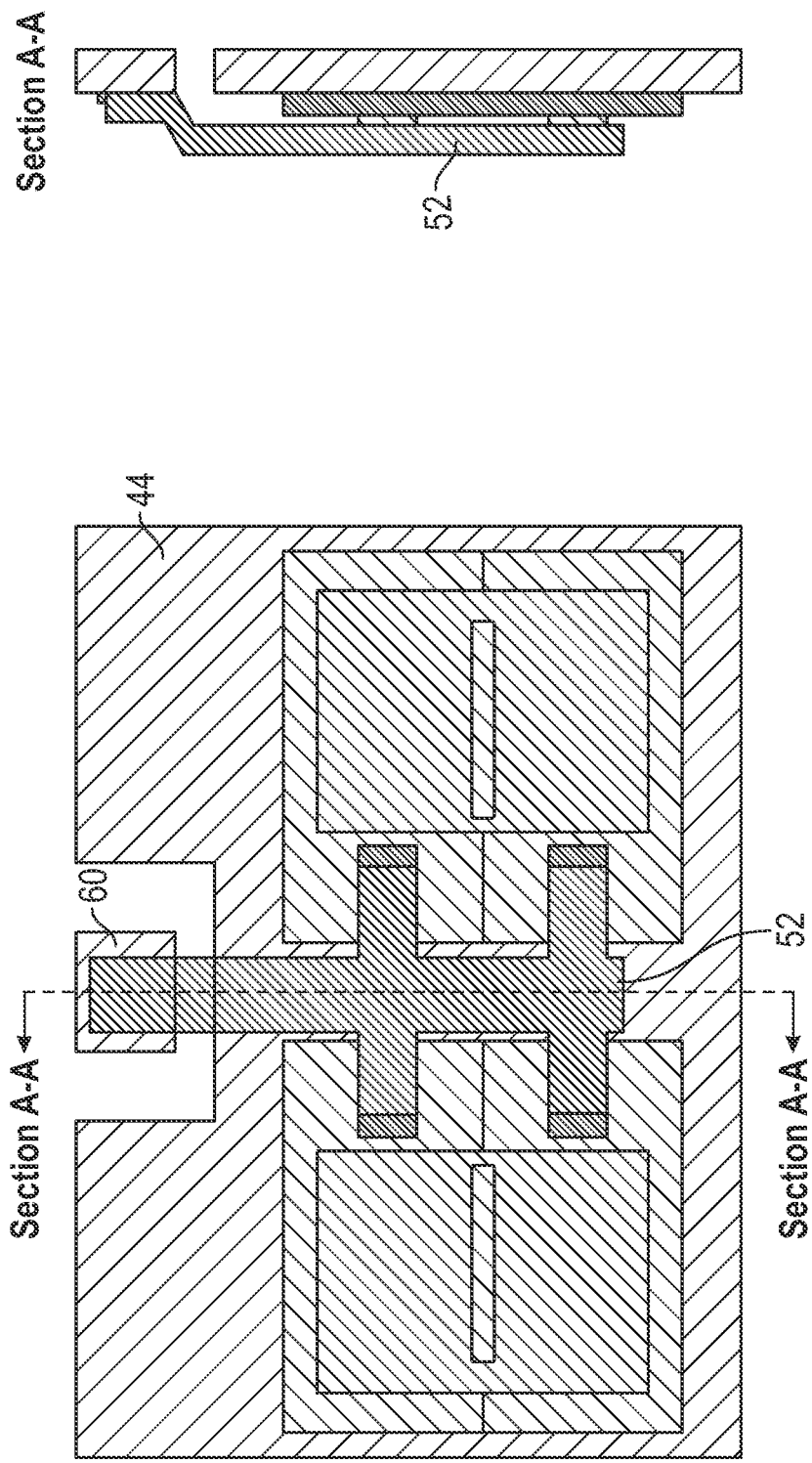
FIG. 19 is a die-side view of the implementation of the second semiconductor package of FIG. 13 following coupling of a clip along with a cross sectional view along sectional line A-A.
Figure 20:
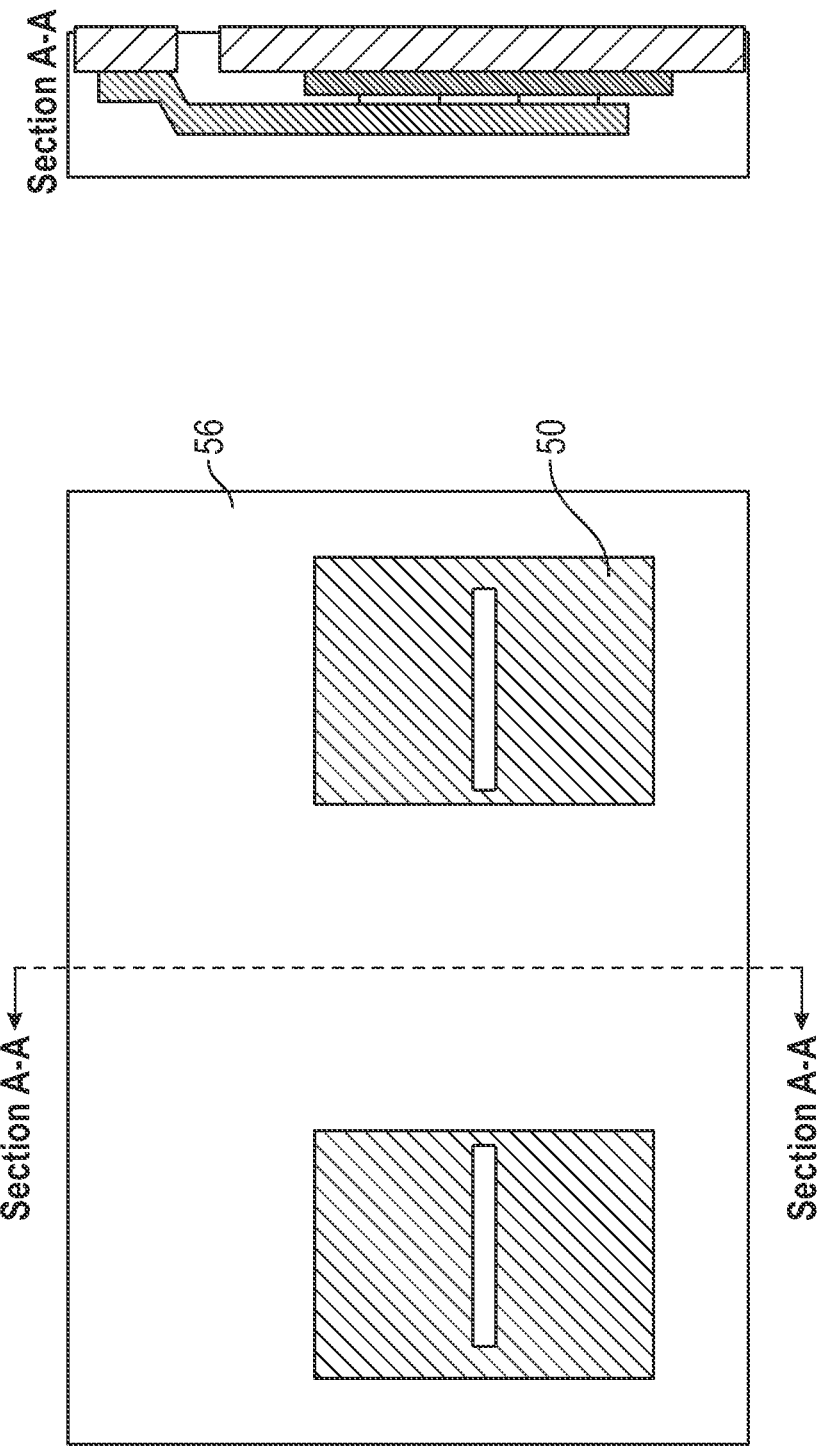
FIG. 20 is a die-side view of the implementation of the second semiconductor package of FIG. 13 following application of mold compound along with a cross sectional view along sectional line A-A.
Figure 21:
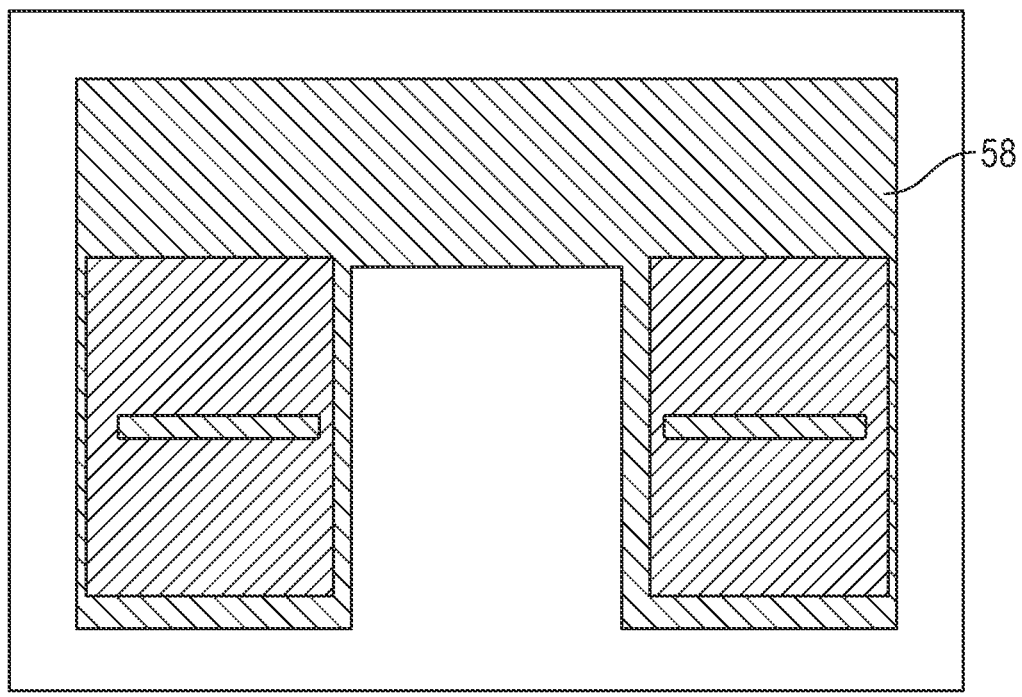
FIG. 21 is a die-side view of the implementation of the second semiconductor package of FIG. 13 following redistribution layer formation.

Referring to FIG. 16, an implementation of a frame 44 is illustrated in a top-down (die-side) view illustrating a drain portion 64 and a gate portion 66. FIG. 17 illustrates the frame 44 following die attach for four different die 46. FIG. 18 illustrates the die 46 after application of the copper slug 50 to the sources of the die 46 forming the first interconnect layer. FIG. 19 illustrates a top view of the package after application of the gate clip 52 to form the second interconnect layer, and includes a cross sectional view along sectional line A-A that illustrates how the gate clip 52 can include one or more bends and angled sections to allow it to couple with the gates of the die and with the gate portion 66 of the frame 44 in various implementations. FIG. 20 includes a die-side down and cross sectional view of the package along the sectional line A-A following application of the encapsulant 56 and grinding of the encapsulant to expose the surfaces of the copper slugs 50. FIG. 21 is a partial see-through view of the redistribution/interconnect layer 58 after plating over the copper slugs which completes the formation of the first interconnect layer. Locations on the redistribution layer 58 are illustrated where additional clips can be coupled to the package during subsequent assembly operations into an automotive high power module (AHPM).

Figure 22:
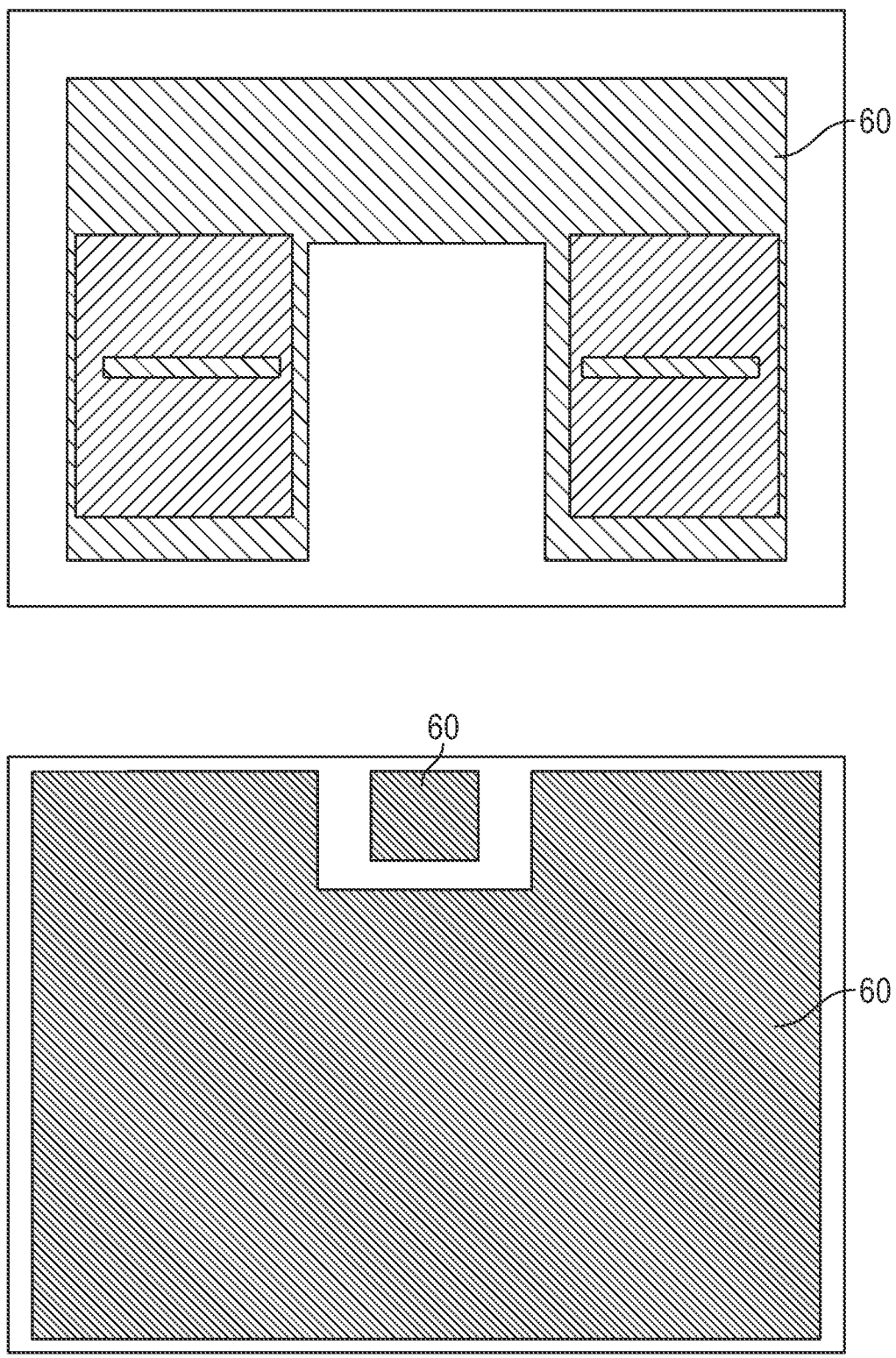
FIG. 22, upper drawing, is a top die-side view of the implementation of the second semiconductor package of FIG. 13 following electroless plating and the lower drawing is a bottom leadframe side view of the package contacts of the second semiconductor package implementations.

The top figure in FIG. 22 illustrates in partial see through a die-side view and a leadframe side view of the package after electroless Au or silver electroplating to form the finish layer 60.

In various implementations of semiconductor packages like those disclosed herein, the principles disclosed herein may be used to route in three dimensions the power and/or signals within the package. In some implementations a gate clip (or the via-enabled interconnect implementations disclosed) may be utilized to move the gate connection to the bottom of the package. In other implementations, either a clip or another interconnect layer implementation disclosed here may be used to route a signal to a side of a package or any other desired location on the exterior of the package. Similar approaches may be used to route the gate, source, or drain to a desired location on the exterior of the package.

In various implementations of semiconductor packages like those disclosed herein, the use of the first and second interconnect layers and/or clip designs like those disclosed may be utilized to design interconnection between all the paralleled devices so that each device is identically connected to the package (and/or each other device) resulting in each device having the substantially the same parasitic inductance, capacitance, and resistance. In this way the devices can be electrically balanced between and relative to each other. This ability to balance/parallel two or more of the devices in the semiconductor package using the interconnect layer and/or clip designs like those disclosed herein may provide greater design freedom.

During formation of the package design, each semiconductor chip in the package is coupled to the same metal layer. In various implementations, as illustrated in this document, this process may be conducted using a leadframe which support each metal layer during fabrication as illustrated in this document. However in other implementations, the coupling may be conducted separately from a leadframe. Where the assembly of the package takes place without the use of a leadframe, multiple die may be coupled to the same metal layer during assembly. Where there are two metal layers each with three die coupled to them, these metal layers may then be placed in a mold/jig for additional assembly processing. The first interconnect layer may then then coupled to the source of each of the semiconductor die. As illustrated on p. 3 of Appendix A of the '709 Application, the same first interconnect layer may then be coupled to the source of each of the three die that are coupled to the same metal layer. The source and drain of each semiconductor die may be coupled to the first interconnect layer and the metal layer, respectively, through, by non-limiting example, a solder, a bonding material, a sintering material, or another material for electrically connecting a pad or connector of the semiconductor die with the material of the first interconnect layer or metal layer. The process of coupling the semiconductor die may include, by non-limiting example, sintering, soldering, bonding, adhering, or any other method of forming an electrical/physical connection between the first interconnect layer or metal layer.

Following coupling of the metal layer and the first interconnect layer, the gate package contact and second interconnect layer may then be inserted into the mold/jig in implementations where a leadframe is not used. In such implementations, the encapsulant is then applied around the surfaces of the semiconductor die, the first interconnect layer, the second interconnect layer, the metal layers, and the gate package contact in such a way to leave closed at least a portion of the first interconnect layer, the second interconnect layer, the metal layers, and the gate package contact.

Where a leadframe is employed, the first interconnect layer, second interconnect layer, and the one or more vias of the second interconnect layer may be formed in a first leadframe, and the metal layer(s) of the package may be formed in a second leadframe which are then bonded to the semiconductor die and to each other via the one or more vias of the second interconnect layer. The resulting assembly may then be placed in a mold and encapsulated with an encapsulant. Following encapsulation, the various encapsulated semiconductor die are then singulated from each other using, by non-limiting example, sawing, lasering, or another method of separating the leadframe and encapsulant material. In other implementations, however where the semiconductor packages are formed one at a time and no lead frame is used no singulation step may be used.

Following the encapsulation process (and singulation process where leadframes are employed), the encapsulated die are now coupled with the remaining package components. As illustrated in perspective view of a package implementation on the left of p. 3 of Appendix A of the '709 Application, each set of encapsulated die is coupled with a package leadframe/substrate on the drain side at the metal layer and at the gate package contact. A clip is then coupled over the first interconnect layer (and over the second interconnect layer in some implementations) and to the package leadframe/substrate to provide electrical connection to the source side of the semiconductor die. Additional clips/leads may be coupled to the package leadframe/substrate in various implementations to form the desired lead structure for the package. Note that in this design, in contrast with the perspective view of the package design on the right of p. 3 of Appendix A of the '709 Application, no wirebonds are used to make the connections with encapsulated die. This may, in some implementations, as illustrated by the outlined area in the package design on the right of p. 3, the use of encapsulated die like those disclosed herein may result in a 50% reduction in the space on the package leadframe/substrate needed to complete the physical and electrical connections with the semiconductor die. In some implementations however, various wirebonds may be utilized to couple the various clips/other components of the package leadframe/substrate with each other and/or with the various leads of the package. In other package implementations, however, no wirebonds may be used.

As illustrated in the partial see-through view in the perspective view of the package implementation on the right of p. 3 of Appendix A of the '709, an additional encapsulant material can be applied over the package leadframe/substrate illustrated on the left and the encapsulated die to complete protecting/insulating the package leadframe/substrate leaving the leads of the package exposed. In various implementations, one or more surfaces of the package leadframe/substrate may be exposed following application of the additional encapsulant and may be designed to couple with one or more heat sinks or other heat dissipating structures.

On p. 4 of Appendix A of the '709 Application, the flow of heat from the semiconductor die (in this case a silicon carbide die) is indicated through the metal layer by the waved lines. Also, the arrows indicate a path for electrical flow from the gate pad of the semiconductor die through the second interconnect layer, via and gate package contact is illustrated as well. In some implementations, the electrical signals to the gate pad may be sent through the gate package contact; in others, the electrical signals to the gate pad may be sent through the second interconnect layer itself.

In various implementations where a metal surface of the package leadframe/substrate is exposed on both sides of the encapsulant, double sided cooling (DSC) techniques can be employed for cooling the semiconductor die. Also, the ability to arrange various silicon carbide die in parallel may be enhanced in a more space efficient arrangement than flip chip or other approaches. A wide variety of potential package implementations may be employed using the principles disclosed in this document.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
    a metal layer;
    two or more die, each of the two or more die coupled to the metal layer at a drain of each of the two or more die, the two or more die and the metal layer arranged in two parallel planes;
    a first interconnect layer coupled at a source of each of the two or more die;
    a second interconnect layer electrically coupled to a gate of each of the two or more die and to a gate package contact through one or more vias; and
    an encapsulant that encapsulates the two or more die and at least a portion of the first interconnect layer, the metal layer, and the second interconnect layer;
    wherein each drain of the two or more die faces towards the metal layer.

2. The package of claim 1, wherein the encapsulant encapsulates a portion of the gate package contact.

3. The package of claim 1, wherein the metal layer and the gate package contact are configured to couple with a substrate.

4. The package of claim 1, wherein the first interconnect layer is configured to couple with a clip and electrically couple with a substrate through the clip.

5. The package of claim 1, wherein each drain of the two or more die is on a surface opposite the source of each of the two or more die.

6. The package of claim 1, wherein the two or more die are power semiconductor die.

7. The package of claim 1, wherein the two or more die comprise silicon carbide.

8. The package of claim 1, wherein the metal layer and the gate package contact are comprised in a leadframe.

9. A semiconductor package comprising:
    two or more encapsulated die assemblies, each encapsulated die assembly comprising:
        two or more die, each of the two or more die coupled to a metal layer at a drain of each of the two or more die;
        a first interconnect layer coupled at a source of each of the two or more die;
        a second interconnect layer electrically coupled to a gate of each of the two or more die and to a gate package contact through one or more vias; and
        an encapsulant surrounding the two or more die and at least a portion of the first interconnect layer, the metal layer, and the second interconnect layer;
    one of a substrate or a leadframe coupled to the two or more encapsulated die assemblies; and
    two or more clips coupled to a source side of the two or more encapsulated die assemblies.

10. The package of claim 9, wherein the one of the substrate or the leadframe is coupled to the two or more encapsulated die assemblies at a drain side of the two or more encapsulated die assemblies.

11. The package of claim 9, wherein at least three die are electrically coupled in parallel in each of the two or more encapsulated die assemblies.

12. The package of claim 9, further comprising two or more leads coupled to the one of the substrate or the leadframe.

13. The package of claim 9, further comprising one or more clips coupled to the one of the substrate or the leadframe.

14. The package of claim 9, further comprising an encapsulant surrounding the two or more encapsulated die assemblies and at least a portion of the one of the substrate or the leadframe.

15. The package of claim 9, wherein the metal layer of the two or more encapsulated die assemblies is comprised in a second leadframe.

16. A method of forming a semiconductor package, the method comprising:
    forming one or more die assemblies by:
        providing two or more die;
        coupling each of the two or more die to a metal layer at a drain of each of the two or more die;
        forming a first interconnect layer coupled to a source of each of the two or more die;
        encapsulating the two or more die, at least a portion of the first interconnect layer, and at least a portion of the metal layer with an encapsulant using one of a transfer molding or laminating process; and
        forming a second interconnect layer electrically coupled to a gate of each of the two or more die and to a gate package contact using one of a clip or one or more vias; and
    coupling the one or more die assemblies to one of a substrate or a leadframe;
    wherein the drain of each of the two or more die face the metal layer.

17. The method of claim 16, further comprising coupling two or more clips to a source side of the one or more die assemblies.

18. The method of claim 16, wherein coupling each of the two or more die to the metal layer further comprises using a silver sintering film and pressure sintering.

19. The method of claim 16, wherein forming one or more die assemblies further comprises grinding the encapsulant to expose at least the portion of the first interconnect layer.

20. The method of claim 16, wherein forming one or more die assemblies further comprises forming one or more vias in the encapsulant using a laser and filling the one or more vias with copper through electroplating.

* * * * *